United States Patent
Shimizu et al.

(10) Patent No.: US 10,647,489 B2
(45) Date of Patent: May 12, 2020

(54) REEL FOR A TAPED SERIES OF ELECTRONIC COMPONENTS AND METHOD OF MANUFACTURING THE SAME

(71) Applicant: Murata Manufacturing Co., Ltd., Nagaokakyo-shi, Kyoto-fu (JP)

(72) Inventors: Yasuhiro Shimizu, Nagaokakyo (JP); Joji Kobayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 946 days.

(21) Appl. No.: 14/704,080

(22) Filed: May 5, 2015

(65) Prior Publication Data
US 2015/0329280 A1 Nov. 19, 2015

(30) Foreign Application Priority Data

May 15, 2014 (JP) ................................ 2014-101427
Mar. 31, 2015 (JP) ................................ 2015-072787

(51) Int. Cl.
*B65D 73/02* (2006.01)
*B65D 85/672* (2006.01)
*H05K 13/00* (2006.01)

(52) U.S. Cl.
CPC .......... *B65D 73/02* (2013.01); *B65D 85/672* (2013.01); *H05K 13/0084* (2013.01)

(58) Field of Classification Search
CPC .. B65D 73/02; B65D 85/672; H05K 13/0417; B65H 75/14
See application file for complete search history.

(56) References Cited

U.S. PATENT DOCUMENTS

| | | | | | |
|---|---|---|---|---|---|
| 1,684,482 | A | * | 9/1928 | Faulkner | B21C 47/28 242/609.1 |
| 2,150,392 | A | * | 3/1939 | Mossberg | B65H 75/14 242/118.8 |
| 2,212,377 | A | * | 8/1940 | Johnson | B65H 75/14 242/118.8 |
| 2,392,492 | A | * | 1/1946 | Morgan | G03B 21/321 242/118.8 |
| 2,438,440 | A | * | 3/1948 | Hirsch | B65H 75/18 242/118.4 |

(Continued)

FOREIGN PATENT DOCUMENTS

| | | |
|---|---|---|
| JP | 2010-173813 A | 8/2010 |
| JP | 2011-157179 A | 8/2011 |

OTHER PUBLICATIONS

Official Communication issued in corresponding Korean Patent Application No. 10-2015-0063946, dated May 4, 2016.

*Primary Examiner* — William A. Rivera
(74) *Attorney, Agent, or Firm* — Keating & Bennett, LLP

(57) ABSTRACT

A reel for a taped series of electronic components includes first and second reel halves. The first reel half includes a first protruding portion and a first flange portion extending radially outward from an end of the first protruding portion. The second reel half includes a second protruding portion and a second flange portion extending radially outward from an end of the second protruding portion. The first and second flange portions each include an outermost end extending in a different direction from the radial direction.

18 Claims, 7 Drawing Sheets

(56) References Cited

U.S. PATENT DOCUMENTS

| | | | | |
|---|---|---|---|---|
| 3,176,932 A * | 4/1965 | Kovaleski | ............ | B65D 85/04 |
| | | | | 242/118.8 |
| 3,542,308 A * | 11/1970 | Starratt | ................ | B21C 47/28 |
| | | | | 242/118.8 |
| 3,717,315 A * | 2/1973 | Kovaleski | ............ | B21C 47/28 |
| | | | | 242/609.1 |
| 3,970,268 A * | 7/1976 | Sheetz | ................ | B65H 75/14 |
| | | | | 242/609.2 |
| D410,991 S * | 6/1999 | Miyazaki | ................... | D22/137 |
| 7,364,113 B2 * | 4/2008 | Ripplinger | ............ | B65H 75/14 |
| | | | | 242/118.7 |
| 8,418,951 B2 * | 4/2013 | Ruggenenti | ............ | B65H 75/14 |
| | | | | 242/118.6 |
| 2009/0230233 A1 * | 9/2009 | Ochi | ................... | B65H 75/14 |
| | | | | 242/614 |
| 2010/0140387 A1 * | 6/2010 | Ruggenenti | ............ | B65H 75/14 |
| | | | | 242/608 |

* cited by examiner

REEL FOR A TAPED SERIES OF ELECTRONIC COMPONENTS AND METHOD OF MANUFACTURING THE SAME

BACKGROUND OF THE INVENTION

1. Field of the Invention

The present invention relates to a reel for a taped series of electronic components and a method of manufacturing the same.

2. Description of the Related Art

A reel for a taped series of electronic components has been known as a holder, for example, of a taped series of electronic components which are electronic components packaged in a tape. For example, Japanese Patent Laying-Open No. 2011-157179 discloses an example of the reel for a carrier tape that can also be used as a reel for a taped series of electronic components.

As disclosed in the above-referenced publication, generally the reel is rotationally driven by rollers arranged outside the reel such that the rollers are in contact with a flange portion of the reel.

In recent years, there has been a demand for weight reduction of the reel. In order to reduce the weight of the reel and thereby reduce the cost, reduction of the thickness of the reel including reduction of the thickness of the flange portion is necessary. Reduction of the thickness of the flange portion makes it more likely that the flange portion is caught in an attachment gap of the roller (a gap formed where the roller is attached) when the reel is being rotationally driven by the rollers. The flange portion caught in the attachment gap of the roller will result in breakage of the flange portion.

SUMMARY OF THE INVENTION

Preferred embodiments of the present invention prevent breakage of the reel for a taped series of electronic components when the reel is being rotationally driven.

A reel for a taped series of electronic components according to a preferred embodiment of the present invention is a reel on which a taped series of electronic components is to be wound. Here, a taped series of electronic components includes a tape including a plurality of cavities spaced from each other along the length direction, and electronic components received respectively in a plurality of cavities. The reel for a taped series of electronic components according to a preferred embodiment of the present invention includes a first reel half formed of a plate material; and a second reel half formed of a plate material and butted against the first reel half. The first reel half includes a first protruding portion protruding toward the second reel half and including a cylindrical circumferential wall and a top plate; and a first flange portion in a disk shape extending outward in a radial direction from an end of the first protruding portion. The second reel half includes a second protruding portion protruding toward the first reel half and including a cylindrical circumferential wall and a top plate; and a second flange portion in a disk shape extending outward in the radial direction from an end of the second protruding portion. A top surface of the first protruding portion and a top surface of the second protruding portion are joined together to define a core. A juncture between the circumferential wall of the first protruding portion and the first flange portion has a radius of curvature larger than a radius of curvature of a juncture between the top plate of the first protruding portion and the circumferential wall of the first protruding portion. A juncture between the circumferential wall of the second protruding portion and the second flange portion has a radius of curvature larger than a radius of curvature of a juncture between the top plate of the second protruding portion and the circumferential wall of the second protruding portion. An outer edge of the first flange portion extends in an out-of-plane direction different from an in-plane direction of the first flange portion. An outer edge of the second flange portion extends in an out-of-plane direction different from an in-plane direction of the second flange portion.

Preferably the outer edge of the first flange portion extends in the out-of-plane direction inclining relative to the in-plane direction of the first flange portion and extends outward along an axial direction of the core, and preferably the outer edge of the second flange portion extends in the out-of-plane direction inclining relative to the in-plane direction of the second flange portion and extends outward along the axial direction of the core.

Preferably the first flange portion and the second flange portion each include a through-hole portion where a through hole is located, and preferably each through-hole portion protrudes outward along an axial direction of the core.

Preferably the top plate of the first protruding portion has a thickness larger than a thickness of the first flange portion, and preferably the top plate of the second protruding portion has a thickness larger than a thickness of the second flange portion.

Preferably the first flange portion and the second flange portion each have a thickness of about 0.40 mm or less, for example.

Preferably a sum of respective thicknesses of the top plate of the first protruding portion and the top plate of the second protruding portion is larger than about 0.40 mm, for example.

Preferably a magnitude of an angle between an outer circumferential surface of the first protruding portion and the first flange portion is less than about 95°, and preferably a magnitude of an angle between an outer circumferential surface of the second protruding portion and the second flange portion is less than about 95°, for example.

Preferably a magnitude of an angle between an outer circumferential surface of the first protruding portion and the first flange portion is more than about 90°, and preferably a magnitude of an angle between an outer circumferential surface of the second protruding portion and the second flange portion is more than about 90°, for example.

Preferably at a juncture between the circumferential wall of the first protruding portion and the first flange portion, a curved portion having a radius of curvature of less than about 0.6 mm is provided, and preferably at a juncture between the circumferential wall of the second protruding portion and the second flange portion, a curved portion having a radius of curvature of less than about 0.6 mm is provided, for example.

Preferably the first flange portion includes a protrusion-recess portion protruded from one main surface and recessed from the other main surface, and preferably the second flange portion includes a protrusion-recess portion protruded from one main surface and recessed from the other main surface.

A method of manufacturing a reel for a taped series of electronic components according to an aspect of various preferred embodiments of the present invention relates to a method of manufacturing a reel for a taped series of electronic components according to another preferred embodiment of the present invention. The method of manufacturing a reel for a taped series of electronic components according to this aspect of various preferred embodiments of the present invention includes the step of forming each of the reel halves by molding a flat-plate-shaped base material with a mold. At this time, a surface roughness of a mold surface of the mold preferably is an arithmetic mean roughness (Ra), defined under JIS B0601-2001, of about 0.5 μm or more, for example.

A method of manufacturing a reel for a taped series of electronic components according to another aspect of various preferred embodiments of the present invention relates to a method of manufacturing a reel for a taped series of electronic components according to another preferred embodiment of the present invention. The method of manufacturing a reel for a taped series of electronic components according to this aspect of various preferred embodiments of the present invention includes the steps of placing a flat-plate-shaped base material on a mold surface of a mold, the mold surface including a molding protruding portion for molding the protruding portions and a molding flat portion located around the molding protruding portion for molding the flange portions; fabricating each of the reel halves by deforming the base material while heating the base material so that the base material extends along the mold surface; and pushing a push pin out of the mold surface to remove each of the reel halves from the mold, the push pin being provided so that the push pin is capable of protruding from the mold surface.

Preferably the base material is decompression-sucked to the mold surface.

In accordance with various preferred embodiments of the present invention, breakage of the reel for a taped series of electronic components when the reel is being rotationally driven is prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
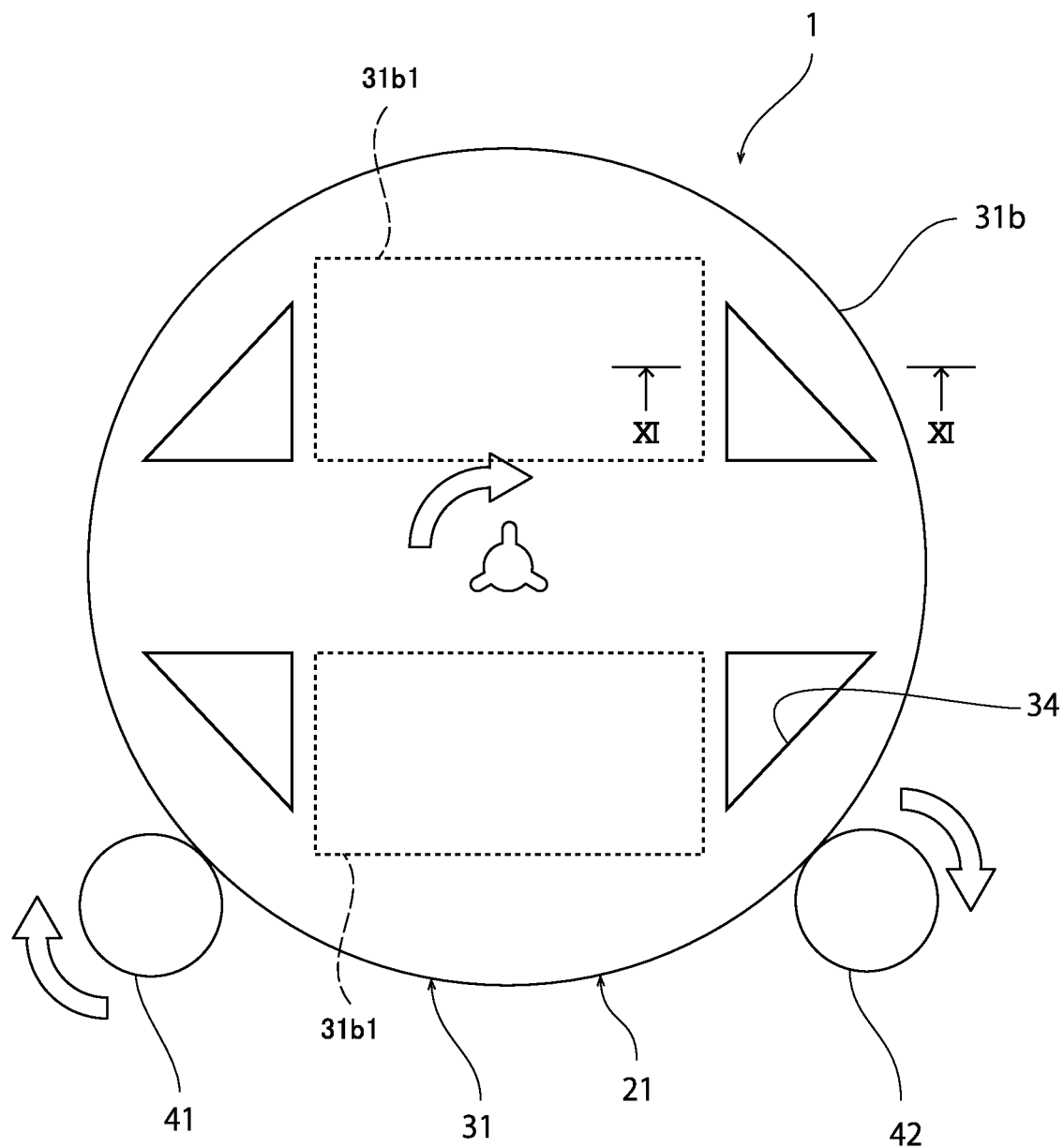
FIG. 1 is a schematic front view of a reel for a taped series of electronic components according to a preferred embodiment of the present invention.

Examples of preferred embodiments of the present invention will hereinafter be described. It should be noted, however, the following preferred embodiments are described merely by way of illustration. The present invention is not limited to the following preferred embodiments at all.

Further, in the drawings each referred to in conjunction with the description of the preferred embodiments, for example, elements or portions having respective functions that are identical or substantially identical to each other are denoted by the same reference characters. The drawings referred to in conjunction with the description of preferred embodiments, for example, are schematic illustrations. The ratio between the dimensions of the elements or portions, for example, illustrated in the drawings may be different from the actual ratio between the dimensions of the elements or portions. The drawings may also be different from each other in terms of the ratio between the dimensions of the elements or portions, for example. The specific ratio between the dimensions of the elements or portions, for example, should be determined in view of the following description.

Figure 2:
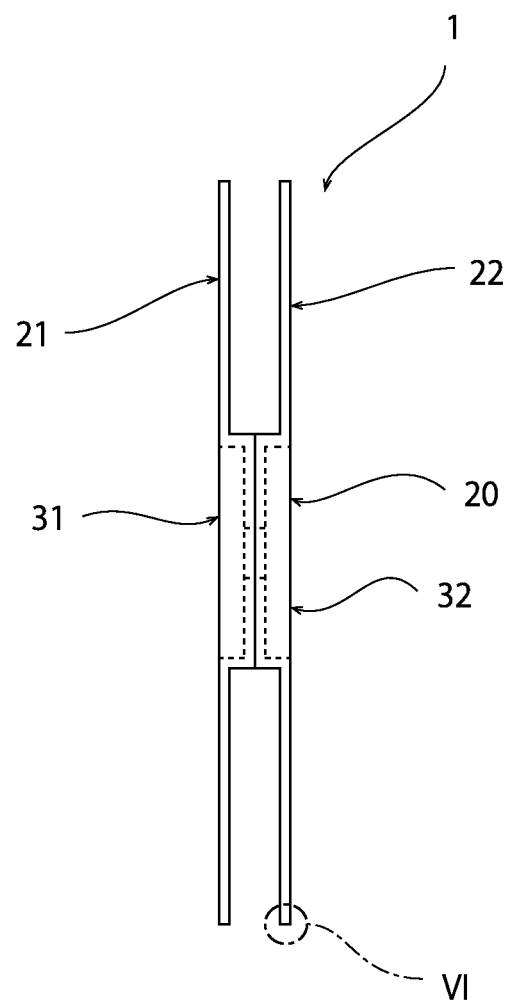
FIG. 2 is a schematic side view of the reel for a taped series of electronic components according to a preferred embodiment of the present invention.
Figure 3:
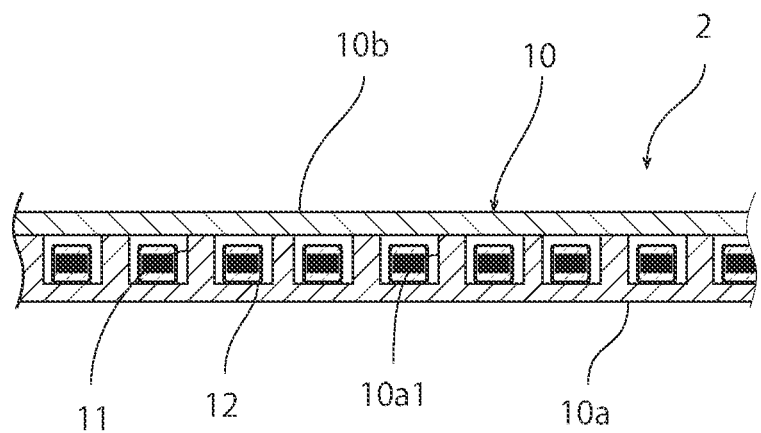
FIG. 3 is a schematic cross-sectional view of a taped series of electronic components along the direction of the length in a preferred embodiment of the present invention.
Figure 4:
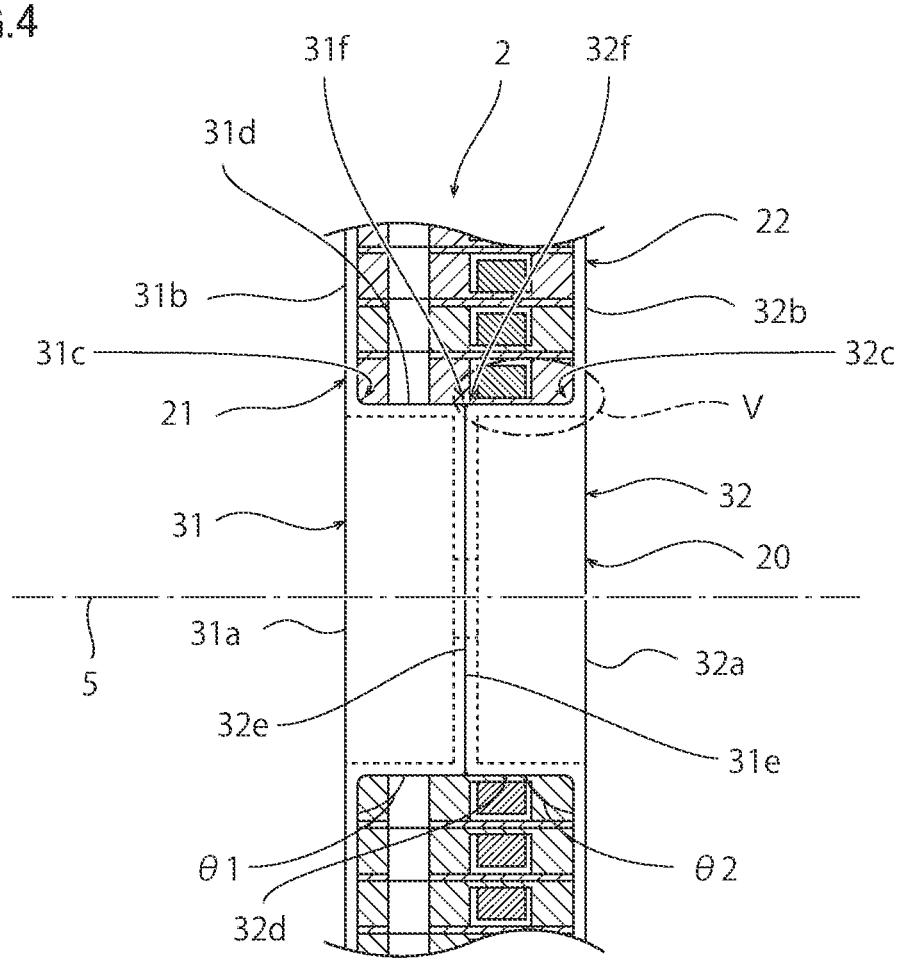
FIG. 4 is an enlarged schematic cross-sectional view of a portion of the reel for a taped series of electronic components according to a preferred embodiment of the present invention.
Figure 5:
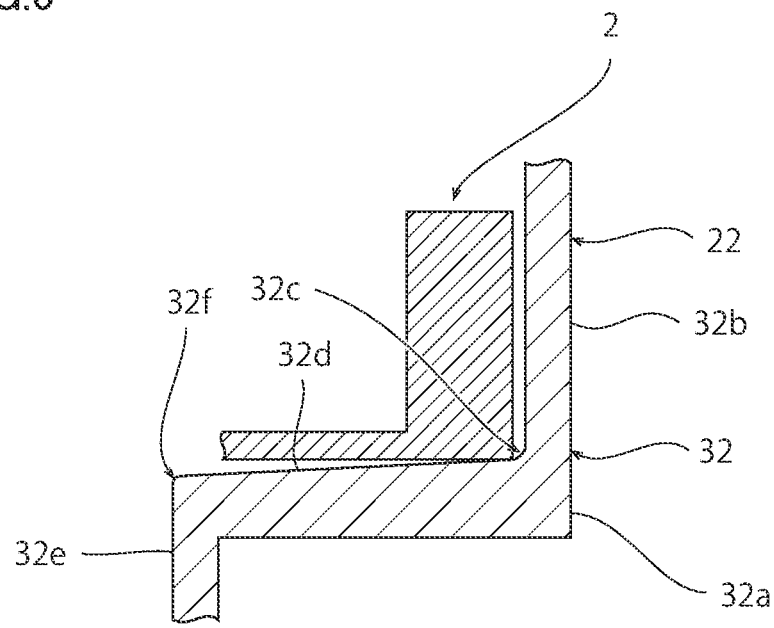
FIG. 5 is a schematic cross-sectional view of a region V shown in FIG. 4.
Figure 6:
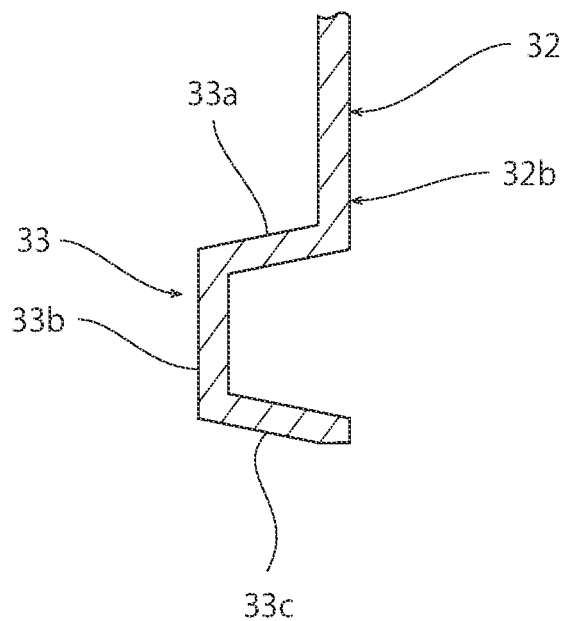
FIG. 6 is a schematic cross-sectional view of a region VI shown in FIG. 2.
Figure 11:
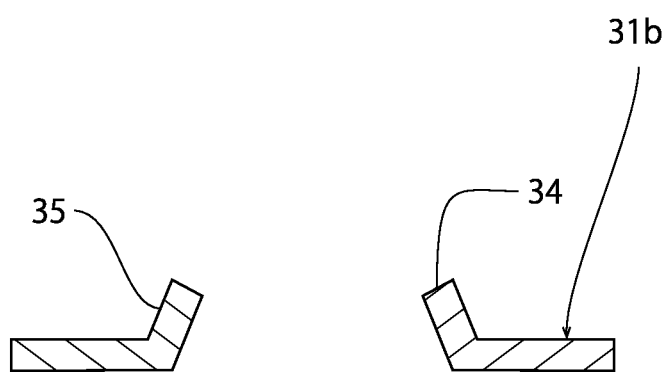
FIG. 11 is a schematic cross-sectional view along a line XI-XI shown in FIG. 1.

FIG. 1 is a schematic front view of a reel for a taped series of electronic components according to the present preferred embodiment. FIG. 2 is a schematic side view of the reel for a taped series of electronic components according to the present preferred embodiment. FIG. 3 is a schematic cross-sectional view of a taped series of electronic components along the direction of the length in the present preferred embodiment. FIG. 4 is an enlarged schematic cross-sectional view of a portion of the reel for a taped series of electronic components according to the present preferred embodiment. FIG. 5 is a schematic cross-sectional view of a region V shown in FIG. 4. FIG. 6 is a schematic cross-sectional view of a region VI shown in FIG. 2. FIG. 11 is a schematic cross-sectional view along a line XI-XI shown in FIG. 1.

A reel 1 for a taped series of electronic components shown in FIGS. 1 and 2 is a reel on which a taped series of electronic components 2 shown in FIG. 3 is wound.

As shown in FIG. 3, a taped series of electronic components 2 includes an elongated tape 10. The tape 10 includes a plurality of cavities 11. The cavities 11 are defined by concave portions provided in a bottom tape 10a of the tape 10. Concave portions 10a1 are covered with a top tape 10b. A plurality of cavities 11 are spaced from each other along the length direction of the tape 10. In each of the plurality of cavities 11, an electronic component 12 is received. The type of the electronic component 12 is not particularly limited. The electronic component 12 may be, for example, a capacitor such as a laminated ceramic capacitor, a resistance element, an inductor, a thermistor, a piezoelectric element, or the like.

The weight of the reel 1 for a taped series of electronic components is preferably less than about 25 grams, and preferably about 10 grams or more, for example.

As shown in FIGS. 2 and 4, the reel 1 for a taped series of electronic components includes a core 20, a first guide portion 21, and a second guide portion 22. The core 20 preferably is cylindrical, approximately cylindrical, columnar or approximately columnar. On the core 20, a taped series of electronic components 2 is wound.

A first guide portion 21 is provided on one side, in the axial direction, of the core 20. The first guide portion 21 restricts the position of one side, in the axial direction, of the taped series of electronic components 2 wound on the reel 1.

A second guide portion 22 is provided on the other side, in the axial direction, of the core 20. The second guide portion 22 restricts the position of the other side, in the axial direction, of the taped series of electronic components 2 wound on the reel 1.

Specifically, the reel 1 for a taped series of electronic components includes a first reel half 31 and a second reel half 32. The first reel half 31 and the second reel half 32 are each preferably made of a resin. The first reel half 31 and the second reel half 32 may each be made of polystyrene, polyester, acrylonitrile, butadiene, styrene copolymer (ABS resin), or the like. The first reel half 31 and the second reel half 32 are each formed of a plate material. Preferably, a portion of the first and second reel halves 31, 32 whose surface area forms about 70% of the total surface area of the first and second reel halves has a thickness of about 0.45 mm or less, for example. Preferably, the first reel half 31 and the second reel half 32 each have a thickness of about 0.45 mm or less, for example. Preferably, the first reel half 31 and the second reel half 32 each have a thickness of about 0.1 mm or more, for example. The first reel half 31 and the second reel half 32 are butted against each other in the axial direction of the core 20.

The first reel half 31 includes a first protruding portion 31a including a cylindrical circumferential wall and a top plate, and a first flange portion 31b in a disk shape. The first protruding portion 31a and the first flange portion 31b are integrally formed. The first protruding portion 31a protrudes toward the second reel half 32. The first flange portion 31b extends outward in the radial direction from an end, located opposite to second reel half 32, of the first protruding portion 31a. The first flange portion 31b defines the first guide portion 21.

The second reel half 32 includes a second protruding portion 32a including a cylindrical circumferential wall and a top plate, and a second flange portion 32b in the shape of a disk. The second protruding portion 32a and the second flange portion 32b are integrally formed. The second protruding portion 32a protrudes toward the first reel half 31. The second flange portion 32b extends radially outward from an end, located opposite to the first reel half 31, of the second protruding portion 32a. The second flange portion 32b defines the second guide portion 22.

The top end of the second protruding portion 32a and the top end of the first protruding portion 31a are butt-joined to each other. The first and second protruding portions 31a, 32a together define a cylindrical or approximately cylindrical core 20. Preferably, the core 20 has a diameter of about 50 mm to about 150 mm, for example. Preferably, the core 20 has a length along the axial direction of about 4 mm to about 60 mm, for example.

The second flange portion 32b and the first flange portion 31b are arranged almost in parallel with each other. Preferably, the first and second flange portions 31b, 32b each have a diameter of about 100 mm to about 400 mm, for example.

As shown in FIG. 11, the first flange portion 31b includes a through-hole portion 35 where a through hole 34 is formed. Likewise, the second flange portion 32b has a through-hole portion 35 where a through hole 34 is formed. In each of the first and second flange portions 31b, 32b, the through-hole portion 35 protrudes outward along the axial direction of the core 20. It is therefore less likely that a taped series of electronic components being wound is caught by the through-hole portion 35. Thus, the taped series of electronic components continues being wound appropriately.

Preferably, the magnitude of an angle θ1 (see FIG. 4) between an outer circumferential surface 31d of the first protruding portion 31a and the first flange portion 31b and the magnitude of an angle θ2 between an outer circumferential surface 32d of the second protruding portion 32a and the second flange portion 32b are each less than about 95°, for example. Preferably, θ1 and θ2 are each more than about 90°, for example.

As shown in FIG. 5, at the juncture between the circumferential wall of the second protruding portion 32a and the second flange portion 32b, a curved portion 32c is provided. Further, at the juncture between the circumferential wall of the first protruding portion 31a and the first flange portion 31b, a curved portion 32f is also provided. The juncture (curved portion 32f) between the circumferential wall of the first protruding portion 31a and the first flange portion 31b and the juncture (curved portion 32c) between the circumferential wall of the second protruding portion 32a and the second flange portion 32b have respective radii of curvature larger than respective radii of curvature of the juncture between the circumferential wall and the top plate of first protruding portion 31a and the juncture between the circumferential wall and the top plate of second protruding portion 32a, respectively. This makes it less likely that a gap is generated at the joint between the first protruding portion 31a and the second protruding portion 32a. This accordingly makes it easy to stabilize the posture of the taped series of electronic components 2 wound on the reel 1.

The radius of curvature of this juncture (curved portion 32c) is preferably less than about 0.6 mm, for example. The radius of curvature of the juncture (curved portion 32c) is preferably about 0.1 mm or more, for example.

As shown in FIG. 1, the first flange portion 31b includes a protrusion-recess portion 31b1 protruded from one main surface and recessed from the other main surface along its thickness direction. Likewise, the second flange portion 32b includes a protrusion-recess portion protruded from one main surface and recessed from the other main surface along its thickness direction. The protrusion-recess portions are thus provided respectively to the first and second flange portions 31b, 32b to improve the stiffness of the first and second flange portions 31b, 32b.

The reel 1 for a taped series of electronic components is driven by rollers 41, 42. Specifically, the rollers 41, 42 are configured such that respective circumferential surfaces are in contact with the circumferential surfaces of the first and second flange portions 31b, 32b. As the rollers 41, 42 are rotated, the frictional force generated between the circumferential surfaces of the rollers 41, 42 and the circumferential surfaces of the first and second flange portions 31b, 32b causes the reel 1 to rotate. Accordingly, the taped series of electronic components 2 is reeled or unreeled. It should be noted that the circumferential surfaces of the rollers 41, 42 are preferably made of a rubber.

For the sake of reducing the weight of the reel 1, it is preferable to reduce the thickness of each of the first and second flange portions 31b, 32b. For example, preferably, the first and second flange portions 31b, 32b each have a thickness of about 0.40 mm or less, for example.

However, mere reduction of the thickness of the first and second flange portions makes it likely that the first and second flange portions are caught in an attachment gap of the roller (a gap formed where the roller is attached). If the first and second flange portions are caught in the attachment gap of the roller, a stress is exerted on the first and second flange portions along the rotational direction, for example, of the first and second flange portions. This may result in breakage of the reel.

As shown in FIG. 4, preferably top surfaces 31e, 32e of the first and second protruding portions 31a, 32a have a thickness larger than the thickness of the first and second flange portions 31b, 32b. In this case, the top surfaces 31e, 32e required to have a high strength are provided with an increased strength.

Preferably the sum of respective thicknesses of the top surfaces 31e, 32e of the first and second protruding portions 31a, 32a is more than about 0.40 mm, and more preferably, the top surfaces 31e, 32e of the first and second protruding portions 31a, 32a each have a thickness of more than about 0.40 mm, for example.

As shown in FIG. 6, each of the first and second flange portions 31b, 32b extends in an in-plane direction perpendicular or substantially perpendicular to the axial direction of the core 20 and includes, at its outer end in the radial direction, an inclining portion 33 which inclines relative to the radial direction. In other words, respective outer circumferential edges of the first and second flange portions 31b, 32b extend in an out-of-plane direction different from the in-plane direction of the first and second flange portions 31b, 32b. The inclining portions 33 prevent the first and second flange portions 31b, 32b from being caught by the attachment gap of the rollers 41, 42 (see FIG. 1). Accordingly, the first and second flange portions 31b, 32b are less likely to be broken when the reel 1 is being rotationally driven.

For example, the inclining portion 33 preferably includes a first portion 33a approximately in the shape of a flat plate inclining relative to the radial direction and extending in one direction along the axis 5 of the core 20 (see FIG. 4), a second portion 33b approximately in the shape of a flat plate extending in the radial direction from the leading end of the first portion 33a, and a third portion 33c approximately in the shape of a flat plate extending, from the leading end of the second portion 33b, in the other direction along the axis 5 of the core 20. Namely, preferably the third portion 33c, which defines the outer edge of the flange portions 31b, 32b, extends in the out-of-plane direction inclining relative to the in-plane direction of the flange portions 31b, 32b and outward in the axial direction. This structure effectively prevents the first and second flange portions 31b, 32b from being caught by the attachment gap of the rollers 41, 42.

It should be noted that the rotational driving of the reel 1 is not limited to the above-described rotational driving caused by rotation of the rollers 41, 42. In some cases, the rollers 41, 42 may merely bias the reel 1 while the elongated tape 10 may be unwound from the reel 1 to cause rotational driving of the reel 1.

Figure 7:
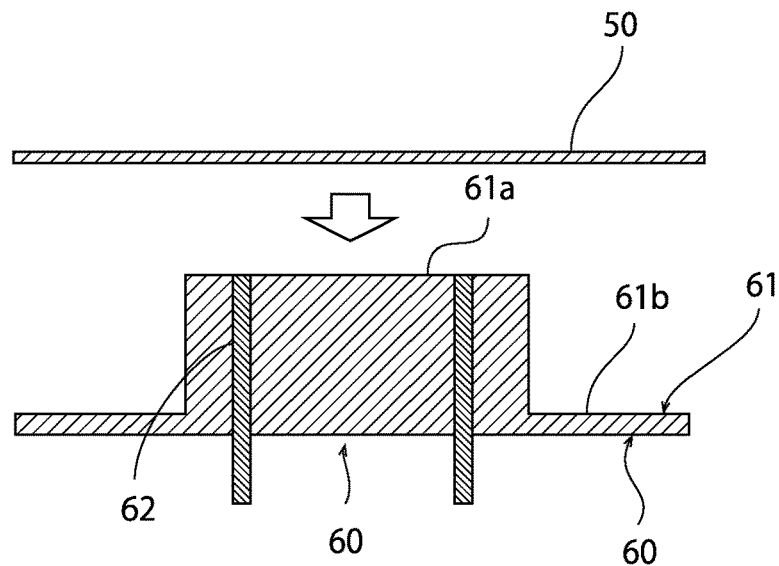
FIGS. 7 to 9 are each a schematic cross-sectional view for illustrating a method of manufacturing a reel half in a preferred embodiment of the present invention.
Figure 8:
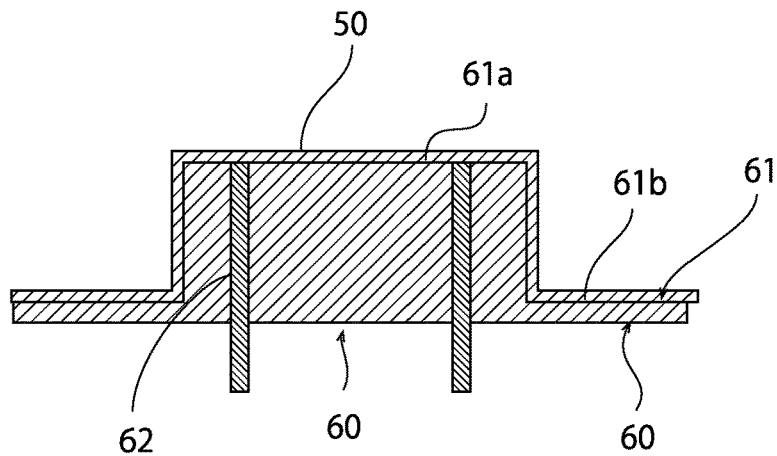
Figure 9:
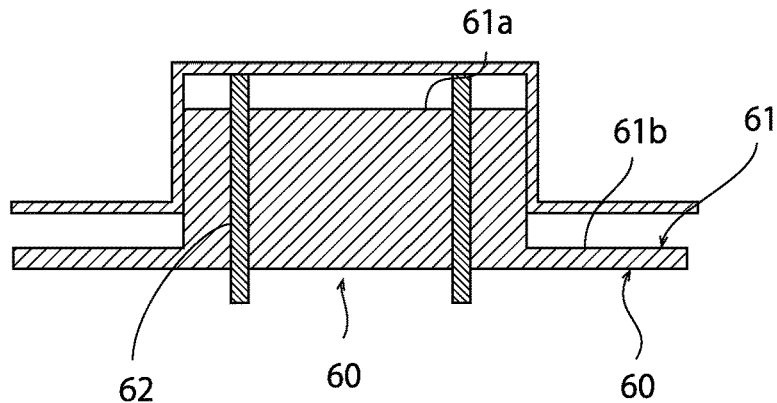

The method of manufacturing the reel 1 is not particularly limited. The reel 1 can be manufactured, for example, in the following manner. In the following, an example of the method of manufacturing the reel 1 will be described with reference to FIGS. 7 to 9. FIGS. 7 to 9 are each a schematic cross-sectional view for illustrating a method of manufacturing a reel half in a preferred embodiment of the present invention.

First, a base material 50 for a reel half shown in FIG. 7 is prepared. The base material 50 can, for example, be formed of a resin sheet or the like.

Second, the base material 50 is molded with a mold 60 to form the reel halves 31, 32. Specifically, the mold 60 includes a mold surface 61 configured to mold the base material 50. The mold surface 61 includes a molding protruding portion 61a configured to mold the base material into the protruding portions 31a, 32a, and a molding flat portion 61b located around the molding protruding portion 61a to mold the base material into the flange portions 31b, 32b. On this mold surface 61, the base material 50 is placed. Then, the base material 50 is deformed while being heated so that the softened base material 50 is caused to extend along the mold surface 61. Specifically, for example, the base material 50 may be pressed against the mold surface 61 and accordingly deformed, or the base material 50 may be decompression-sucked to the mold surface 61 and accordingly deformed. Alternatively, the molten base material 50 may be applied to the top of mold surface 61 to form the flange portion 31b, 32b.

After this, the molded first reel half 31 and the second reel half 32 are joined together to complete the reel 1.

It should be noted that each of the first and second reel halves 31, 32 may also be formed by injection molding.

Figure 10:
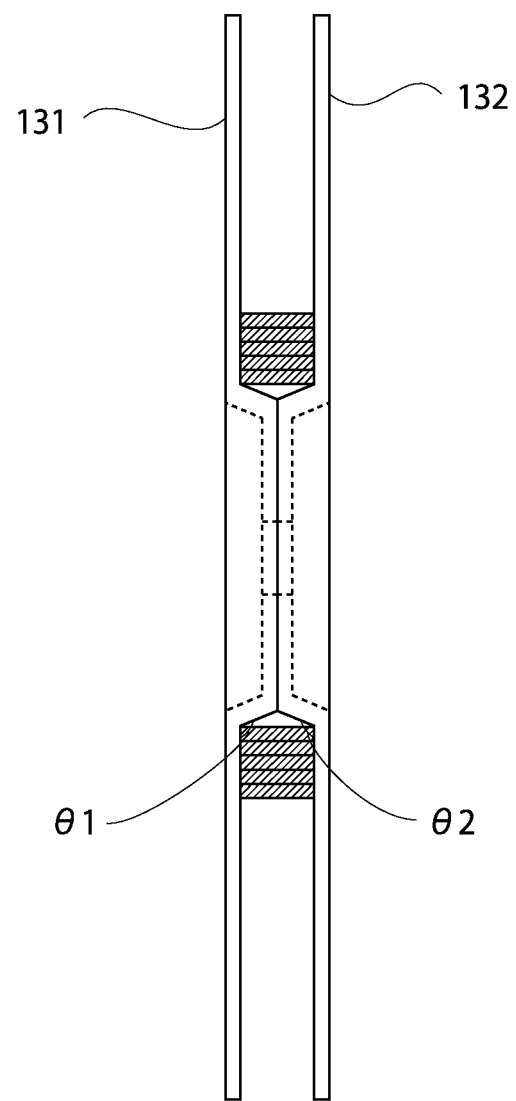
FIG. 10 is a schematic side view of a reel for a taped series of electronic components according to a reference example.

FIG. 10 is a schematic side view of a reel for a taped series of electronic components according to a reference example. In terms of ease of removal of the base material 50 from the mold 60 after the base material 50 is caused to extend along the mold 60, preferably the angles θ1, θ2 are made larger as shown, for example, in FIG. 10. The increase in angles θ1, θ2, however, causes the stiffness of the reel halves 131, 132 to decrease. Due to this, the reel halves 131, 132 may be deformed to increase the distance between the reel half 131 and the reel half 132, for example. Deformation of the reel halves 131, 132 may cause the regularity of winding of a taped series of electronic components to be lost.

In view of the above, θ1 and θ2 of the reel 1 according to the present preferred embodiment preferably are each less than about 95°, for example. The reel halves 31, 32 are thus less likely to deform. The regularity of winding of the taped series of electronic components 2 is therefore less likely to be lost. If θ1, θ2 are each less than about 90°, however, strong friction occurs between the reel halves 31, 32 and the taped series of electronic components 2, which may result in an unintended damage to the reel bodies 31, 32. It is therefore preferable that θ1, θ2 are each larger than about 90°, for example.

In the case where θ1, θ2 are each less than about 95°, it may be difficult to remove the reel halves 31, 32 from the mold 60. For the sake of facilitating removal of the reel halves 31, 32 from the mold 60, the surface roughness of the mold surface 61 of the mold 60 is set preferably to an arithmetic mean roughness (Ra), defined under JIS (Japanese Industrial Standard) B0601-2001, of about 0.5 μm or more, which is more preferably about 1.0 μm or more, for example. It should be noted that the surface roughness of the mold surface 61 of the mold 60 is preferably an arithmetic mean roughness (Ra) mentioned above of about 5 μm or less, and more preferably about 2 μm or less, for example.

For the sake of preventing the loss of regularity of winding of the taped series of electronic components 2, the juncture (curved portion 32c) has a radius of curvature of preferably less than about 0.6 mm, for example.

Further, as shown in FIG. 9, it is preferable to provide a pin 62 which is capable of protruding from the mold surface 61 and push this pin 62 out of the mold surface 61, and remove the reel halves 31, 32 from the mold 60. Preferably, a plurality of pins 60 are provided, and preferably three or more pins 60 are provided.

The thickness of each of the above-described portions can be measured with a micrometer.

Further, as to the radius of curvature of each of the above-described portions, a corresponding member may be polished so that the site whose radius of curvature is to be measured is exposed. Then, a picture of the exposed cross section may be taken and the picture may be analyzed to measure the radius of curvature.

Figure 12:
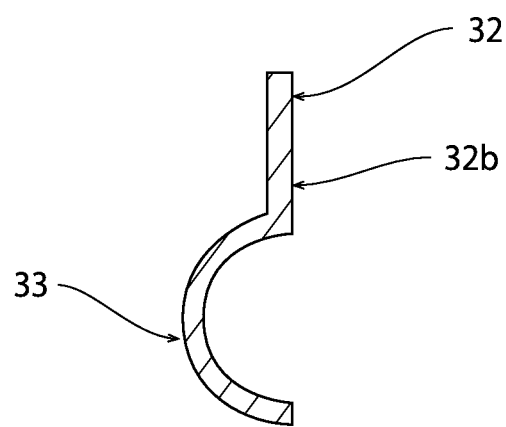
FIG. 12 is an enlarged schematic cross-sectional view of an outermost end of a flange portion of a reel for a taped series of electronic components in a modification of a preferred embodiment of the present invention.

FIG. 12 is an enlarged schematic cross-sectional view of an outermost end of a flange portion of a reel for a taped series of electronic components in a modification of a preferred embodiment of the present invention.

Regarding the foregoing preferred embodiment, an example is described above where inclining portion 33 includes the first portion 33a approximately in the shape of a flat plate inclining relative to the radial direction and extending in one direction along the axis of core 20, the second portion 33b approximately in the shape of a flat plate extending in the radial direction from the leading end of the first portion 33a, and the third portion 33c approximately in the shape of a flat plate extending, from the leading end of the second portion 33b, in the other direction along the axis of the core 20.

The present invention, however, is not limited to this structure. For example, as shown in FIG. 12, the outermost end of the flange portion of the reel for a taped series of electronic components may be in the shape of a curved plate having an arc shape as seen in its cross section. Namely, the inclining portion 33 defining the outer circumferential edge of the flange portion may be formed of a portion shaped like a curved plate located at the outermost end of the flange portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A reel for a taped series of electronic components, the taped series of electronic components being configured to be wound on the reel, the reel comprising:
   a first reel half including a plate material; and
   a second reel half including a plate material and butted against the first reel half;
   the first reel half including:
      a first protruding portion protruding toward the second reel half and including a cylindrical circumferential wall and a top plate; and
      a first flange portion in a disk shape extending outward in a radial direction from an end of the first protruding portion;
   the second reel half including:
      a second protruding portion protruding toward the first reel half and including a cylindrical circumferential wall and a top plate; and
      a second flange portion in a disk shape extending outward in the radial direction from an end of the second protruding portion; wherein
   a top surface of the top plate of the first protruding portion including an axis of the first reel half and a top surface of the top plate of the second protruding portion including an axis of the second reel half are joined together to provide a core defined by the first protruding portion and the second protruding portion;
   a juncture between the circumferential wall of the first protruding portion and the first flange portion has a radius of curvature larger than a radius of curvature of a juncture between the top plate of the first protruding portion and the circumferential wall of the first protruding portion;
   the radius of curvature of the juncture between the circumferential wall of the first protruding portion and the first flange portion is about 0.1 mm or more and less than about 0.6 mm;
   a juncture between the circumferential wall of the second protruding portion and the second flange portion has a radius of curvature larger than a radius of curvature of a juncture between the top plate of the second protruding portion and the circumferential wall of the second protruding portion;
   the radius of curvature of the juncture between the circumferential wall of the second protruding portion and the second flange portion is about 0.1 mm or more and less than about 0.6 mm;
   an outer edge of the first flange portion extending in an out-of-plane direction different from an in-plane direction of the first flange portion; and
   an outer edge of the second flange portion extending in an out-of-plane direction different from an in-plane direction of the second flange portion.

2. The reel for a taped series of electronic components according to claim 1, wherein
   the outer edge of the first flange portion extends in the out-of-plane direction inclining relative to the in-plane direction of the first flange portion and extends outward along an axial direction of the core; and
   the outer edge of the second flange portion extends in the out-of-plane direction inclining relative to the in-plane direction of the second flange portion and extends outward along the axial direction of the core.

3. The reel for a taped series of electronic components according to claim 1, wherein
   the first flange portion and the second flange portion each include a through-hole portion where a through hole is located; and
   each of the through-hole portions protrudes outward along an axial direction of the core.

4. The reel for a taped series of electronic components according to claim 1, wherein
   the top plate of the first protruding portion has a thickness larger than a thickness of the first flange portion; and
   the top plate of the second protruding portion has a thickness larger than a thickness of the second flange portion.

5. The reel for a taped series of electronic components according to claim 1, wherein the first flange portion and the second flange portion each have a thickness of about 0.40 mm or less.

6. The reel for a taped series of electronic components according to claim 1, wherein a sum of respective thicknesses of the top plate of the first protruding portion and the top plate of the second protruding portion is larger than about 0.40 mm.

7. The reel for a taped series of electronic components according to claim 1, wherein
   a magnitude of an angle between an outer circumferential surface of the first protruding portion and the first flange portion is less than about 95°; and
   a magnitude of an angle between an outer circumferential surface of the second protruding portion and the second flange portion is less than about 95°.

8. The reel for a taped series of electronic components according to claim 1, wherein
   a magnitude of an angle between an outer circumferential surface of the first protruding portion and the first flange portion is more than about 90°; and a magnitude of an angle between an outer circumferential surface of the second protruding portion and the second flange portion is more than about 90°.

9. The reel for a taped series of electronic components according to claim 1, wherein
the first flange portion includes a protrusion-recess portion protruded from one main surface and recessed from the other main surface; and
the second flange portion includes a protrusion-recess portion protruded from one main surface and recessed from the other main surface.

10. The reel for a taped series of electronic components according to claim 1, wherein the electronic components include one of a capacitor, a resistance element, an inductor, a thermistor, and a piezoelectric element.

11. The reel for a taped series of electronic components according to claim 1, further comprising a first guide portion on one side of the core and a second guide portion on another side of the core, wherein the first and second guide portions are configured to guide the taped series of electronic components wound on the reel.

12. The reel for a taped series of electronic components according to claim 1, wherein
the first and second flange portions include inclining portions inclining relative to the in-plane direction of the respective one of the first and second flange portions and extending outward along an axial direction of the core;
each of the inclining portions includes a first portion inclining relative to the radial direction and extending in one direction along the axial direction of the core, a second portion extending in the radial direction from a leading end of the first portion, and a third portion extending from a leading end of the second portion in the other direction along the axial direction of the core.

13. The reel for a taped series of electronic components according to claim 12, wherein the third portion defines outer edges of the first and second flange portions and extends in the out-of-plane direction inclining relative to the in-plane direction of the flange portions and outward in the axial direction of the core.

14. A method of manufacturing a reel for a taped series of electronic components as recited in claim 1, the comprising the step of forming each of the reel halves by molding a flat-plate-shaped base material with a mold, wherein a surface roughness of a mold surface of the mold is an arithmetic mean roughness, defined under JIS B0601-2001, of about 0.5 μm or more.

15. The method according to claim 14, wherein the electronic components include one of a capacitor, a resistance element, an inductor, a thermistor, and a piezoelectric element.

16. The method of manufacturing a reel for a taped series of electronic components as recited in claim 1, the method comprising the steps of:
placing a flat-plate-shaped base material on a mold surface of a mold, the mold surface including a molding protruding portion configured to mold the protruding portions and a molding flat portion located around the molding protruding portion configured to mold the flange portions;
fabricating each of the reel halves by deforming the base material while heating the base material so that the base material extends along the mold surface; and
pushing a push pin out of the mold surface to thereby remove each of the reel halves from the mold, the push pin being provided so that the push pin is capable of protruding from the mold surface.

17. The method according to claim 16, wherein the base material is decompression-sucked to the mold surface.

18. The method according to claim 17, wherein the electronic components include one of a capacitor, a resistance element, an inductor, a thermistor, and a piezoelectric element.

* * * * *